(12) United States Patent  (10) Patent No.: US 7,791,890 B2
Ishida  (45) Date of Patent: Sep. 7, 2010

(54) COMPUTER SYSTEM

(75) Inventor: Hisashi Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 150 days.

(21) Appl. No.: 11/542,837

(22) Filed: Oct. 4, 2006

(65) Prior Publication Data

US 2007/0081308 A1    Apr. 12, 2007

(30) Foreign Application Priority Data

Oct. 7, 2005    (JP) .............................. 2005-295218

(51) Int. Cl.
- H05K 5/00 (2006.01)
- H05K 7/16 (2006.01)
- H05K 7/14 (2006.01)
- A47B 81/00 (2006.01)
- A47F 7/00 (2006.01)
- H01R 25/00 (2006.01)

(52) U.S. Cl. .................. 361/727; 361/724; 361/796; 361/679.49; 361/690; 312/223.2; 211/26; 439/638; 454/184

(58) Field of Classification Search ......... 361/679–686, 361/724–727, 796–798, 679.01–679.45, 361/679.55–679.59; 312/223.1, 223.2; 211/26; 439/638

See application file for complete search history.

(56) References Cited

U.S. PATENT DOCUMENTS 5,045,960 A * 9/1991 Eding ....................... 360/97.01
5,579,204 A * 11/1996 Nelson et al. ........... 361/679.32
5,675,472 A * 10/1997 Hamerton-Kelly ........... 361/684
6,148,352 A * 11/2000 Coale et al. .................. 710/100
2004/0212973 A1* 10/2004 Ice ............................. 361/796

FOREIGN PATENT DOCUMENTS

| JP | S49-43159 | 4/1974 |
|---|---|---|
| JP | 05-224777 | 9/1993 |
| JP | 5-267860 | 10/1993 |
| JP | 08-211975 | 8/1996 |
| JP | 10-161896 | 6/1998 |
| JP | 10-335854 | 12/1998 |
| JP | 2000-276257 | 10/2000 |
| JP | 2002-353664 A | 12/2002 |
| JP | 2005-509213 A | 4/2005 |

OTHER PUBLICATIONS

Japanese Official Action dated May 18, 2010 together with a partial English language translation.

* cited by examiner

Primary Examiner—Zachary M Pape
Assistant Examiner—Nidhi Desai
(74) Attorney, Agent, or Firm—Scully, Scott, Murphy & Presser, P.C.

(57) ABSTRACT

A computer system includes a rack, a computer module and an interface-dedicated module to be mounted therein, and an intra-rack management module. The rack has a rear panel for power supply to and signal connection among modules, and the modules permit plug-in mounting onto the rear panel of the rack. The computer module has behind the computer a dedicated adapter which makes possible plug-in mounting of the computer onto the rack and coordinates signals between the computer and the rear panel.

18 Claims, 6 Drawing Sheets

COMPUTER SYSTEM

BACKGROUND OF THE INVENTION

1. Field of the Invention

The present invention relates to a computer system, and more particularly to a computer system which, mounted on its rack with modules including a plurality of computers, disk units and so forth, carries out power supply to and signal connection among the modules.

2. Description of the Related Art

According to the conventional practice, when a plurality of servers are to be mounted on a standard rack such as a 19-inch one to configure a system, cables for power supply to the servers and cables for connecting the plurality of servers have to be arranged on the rear side of the rack. Architecting the arrangement of these cables involves a problem that, in addition to the time taken to accomplish connection while disposing of extra lengths of cables, the arranged cables obstruct the ventilation flue of cooling air flow.

For instance, JP-A No. 267860/1993 discloses a computer system in which three vertically long passages are fitted on a side of a frame to accommodate electronic device modules, such as computer units and disk units, of which one allows cables from the modules to pass, another feeds cooling air to the modules and the remaining one permits a commercial power supply cord to pass.

In recent years, blade servers which permit cableless mounting of server modules on a chassis have emerged. However, the blade server modules, which conform to respective individual manufacturers' own designs, involve a problem of incompatibility among different makes.

Moreover, there is another problem that developing the server module to the manufacturer's own design entails a high development cost. Moreover, when configuring a conventional system, a plurality of chassis has to be mounted within a rack, and this necessitates cables for connecting the chassis among one another, making it impossible to realize a cableless arrangement within the rack.

SUMMARY OF THE INVENTION

The present invention provides a system structure for computer systems representing solutions to the problems noted above.

A computer system according to the invention includes a plurality of modules for configuring the computer system; and a rack having a rear panel for power supply to and signal connection among the modules mounted inside, wherein each of the modules comprises a device and a dedicated adapter for making possible plug-in mounting on the rack and coordinating power supply and signal connection between the device and the rear panel.

The computer system according to the invention enables a commercially available ordinary computer, which is to be mounted on a standard rack such as a 19-inch one, to permit its plug-in mounting onto a dedicated rack according to the invention irrespective of the make or size if only it has a prescribed interface, by fitting a dedicated adapter onto the rear face of the computer to modularize it, resulting in the advantage of enabling the intra-rack management module to perform unified management and a common external interface for the rack to be made usable.

There further is the advantage that power supply to and connection among the modules in the rack are accomplished with the dedicated rear panel, and accordingly there is no need to execute complex cable connection behind the rack every time a commercially available ordinary server is mounted on the rack or an additional chassis for blade servers is mounted.

DESCRIPTION OF THE EXEMPLARY EMBODIMENTS

Next, exemplary embodiments of the present invention will be described in detail with reference to the accompanying drawings.

Figure 1:
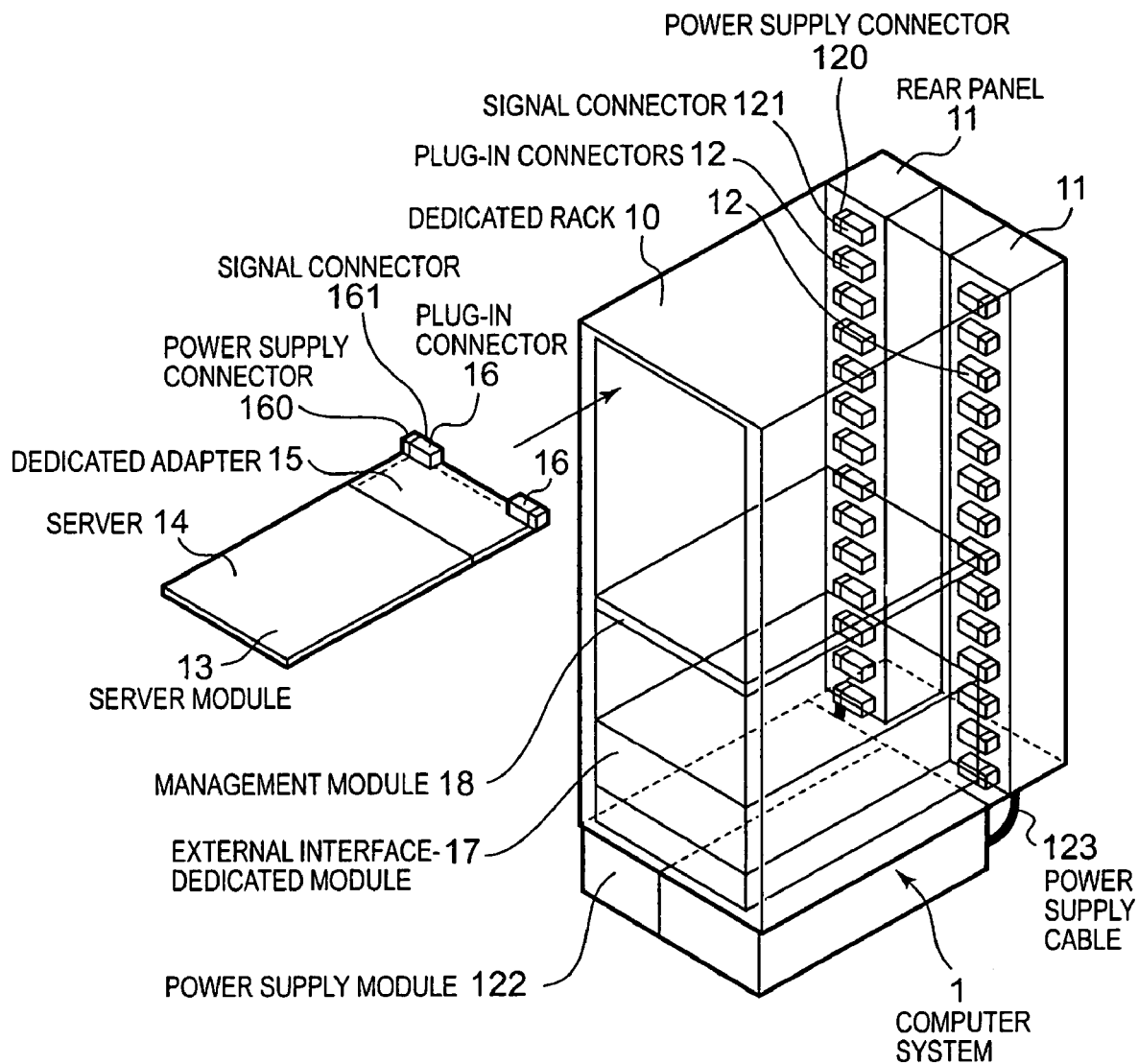
FIG. 1 shows a perspective view of the configuration of a computer system, which is a first exemplary embodiment of the present invention.

As shown in FIG. 1, in a computer system which is a first exemplary embodiment of the invention, a dedicated rack 10 to accommodate modules configuring the computer system, has rear panels 11 on its back.

The rear panels 11 have inside them wiring for power supply to and signal connection among the modules to be mounted on the dedicated rack 10. Plug-in connectors 12 which make possible plug-in mounting of modules are fitted to the parts of the rear panels 11 for connection to the modules.

The plug-in connectors 12 have a power supply connector 120 for supplying power and a signal connector 121 for supplying signals to the modules.

Further the rear panels 11, positioned on two sides of the rear face of the dedicated rack 10, make possible double structuring of power supply routing and signal connection routing so that a computer system 1 may not stop even if one of the rear panels 11 runs into trouble. Each of the rear panels 11 is supplied with power from a power supply module 122 via a power supply cable 123. One separate power supply module 122 is provided on the rear panel 11 on each side to make possible double structuring of power supply.

A server module 13, which is a computer module to be mounted on the dedicated rack 10, has a commercially available ordinary server 14, which is a computer, and a dedicated adapter 15.

The dedicated adapter 15 ensures compatibility of interface signals between the commercially available ordinary server 14 and the dedicated rack 10, and has plug-in connectors 16, matching the plug-in connectors 12 on the rear panels 11, to make possible plug-in mounting on the dedicated rack 10. Thus, it performs within the dedicated adapter 15 a transfer from an interface deriving from the commercially available ordinary server 14 to another interface demanded by the dedicated rack 10.

The plug-in connectors 16 have a power supply connector 160 matching a power supply connector 120 on the rear panel 11 and a signal connector 161 matching a signal connector 121 on the rear panel 11.

Within the dedicated rack 10, there are an external interface-dedicated module 17 taking charge of interfacing with outside the dedicated rack 10 and a management module 18 taking charge of unified management of modules within the dedicated rack 10, and the modules are tightly joined by the rear panels 11.

As described above, if the commercially available ordinary server 14, which is a server intended for mounting on a standard rack such as a 19-inch rack, has a prescribed interface, this embodiment of the invention permits its plug-in mounting onto the dedicated rack 10 according to the invention irrespective of the make or size by fitting a dedicated adapter 15 onto the rear face of the server 14 to make it a server module, resulting in the advantage of enabling the management module 18 to perform unified management and the common external interface 17 for the rack to be made usable.

There further is the advantage that power supply to and connection among the modules in the dedicated rack 10 are accomplished with the dedicated rear panels 11, and accordingly there is no need to execute complex cable connection behind the rack every time a commercially available ordinary server 14 is mounted on the dedicated rack 10 or an additional chassis for blade servers is mounted.

Figure 2:
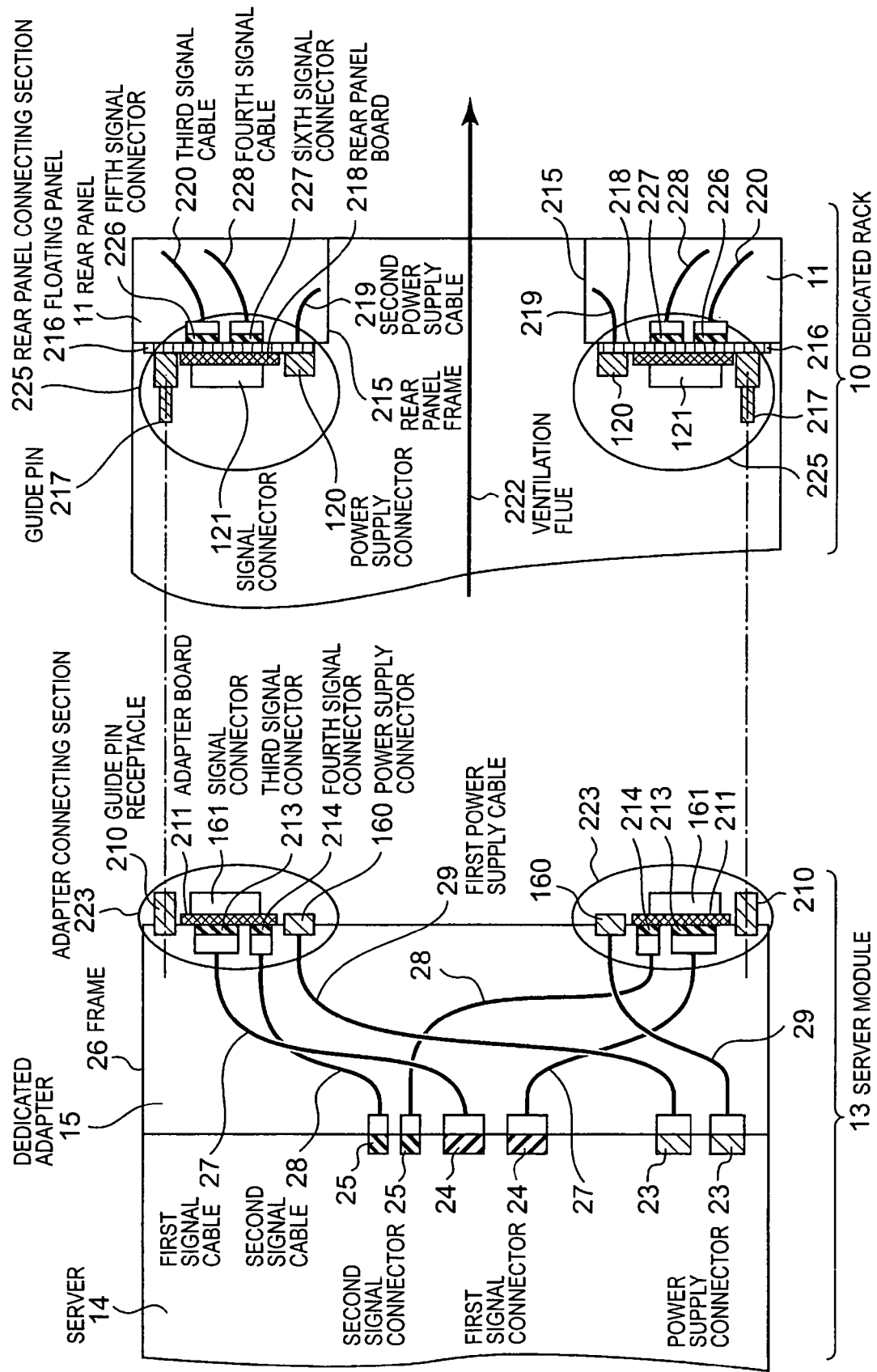
FIG. 2 shows a sectional view of one example of connecting section between the server module 13 and the rear panels 11 in FIG. 1.

FIG. 2 shows a sectional view of one example of connecting section between the server module 13 and the rear panels 11 in FIG. 1.

The dedicated adapter 15 is fitted to the rear side of the commercially available server 14. The thickness of the dedicated adapter 15 is either equal to or less than that of the commercially available server 14. The commercially available server 14 and the dedicated adapter 15 constitute the server module 13.

The dedicated adapter 15 comprises a frame 26, an adapter connecting sections 223 and various cables. Each of the adapter connecting sections 223 connected to the rear panel 11 side comprises an adapter board 211 mounted with a guide pin receptacle 210, a signal connector 161 which is a plug-in connector on each of the front and rear sides, a third signal connector 213 and a fourth signal connector 214 and a power supply connector 160 which is the cable connector connecting section of a first power supply cable 29.

The power supply connector 160, which is the cable connector connecting section of the guide pin receptacle 210, the adapter board 211 and the first power supply cable 29, is fitted to the frame 26.

Two adapter connecting sections 223 are symmetrically arranged on two sides of the rear face of the server module 13. This double structure is intended to keep the system immune from any trouble arising in either one of the adapter connecting sections 223.

The third signal connector 213 and the fourth signal connector 214 mounted on the adapter board 211 are connected to a first signal connector 24 and a second signal connector 25, both intended for interfacing use and disposed on the rear face of the commercially available server 14 respectively via a first signal cable 27 and a second signal cable 28. The first power supply cable 29 is a cable for relaying between a power supply connector 23 disposed on the rear face of the commercially available server 14 and the power supply connectors 160 of the adapter connecting sections 223.

The rear panels 11 for connecting various modules mounted on the dedicated rack 10 from one to another comprise a plurality of rear panel connecting sections 225.

Each of the rear panel connecting sections 225 comprises a floating panel 216, a guide pin 217, a signal connector 121 which is a second plug-in connector on each of the front and rear sides, a rear panel board 218 mounted with a fifth signal connector 226 and a sixth signal connector 227, and a power supply connector 120 which is the cable connector connecting section of a second power supply cable 219. The floating panel 216 has a function to float off a rear panel frame 215. Namely, the fitting holes of the floating panel 216 are long holes, and the panel 216 is screwed onto the rear panel frame 215 with a slight gap in-between.

The power supply connector 120 connected to the guide pin 217, the rear panel board 218 and the second power supply cable 219 are fitted to the floating panel 216.

The fifth signal connector 226 and the sixth signal connector 227 mounted on the rear panel board 218 are connected to rear panel connecting sections for other modules to be mounted on the dedicated rack 10 by a third signal cable 220 and a fourth signal cable 227.

Two rear panel connecting sections 225 are disposed symmetrically on the two sides of a dedicated rack 228. This double structure is intended to keep the system immune from any trouble arising in either one of the adapter connecting sections 223.

The space between the adapter connecting sections 223 on the two sides constitutes a ventilation flue 222 for cooling the air in the commercially available server 14. Since all the cables connecting the modules are positioned within the rear panel frame 215, they do not obstruct the ventilation flue 222 and a smooth air flow is thereby ensured.

When the server module 13 is to be mounted on the dedicated rack 10, first the guide pin 217 is induced into the guide pin receptacle 210 and aligned, followed by connection between the signal connector 161 and the signal connector 121. The power supply connectors 160 and 120 are also connected at the same time as the signal connectors at the time of plug-in connection.

Turning the commercially available server 14 into a server module by fitting the dedicated adapter 15 in this way, realizes a structure to allow the server to be plugged into the rack, and the mounting of the server is thereby facilitated.

Although the real panel 11 side is structured for floating in this embodiment, the dedicated adapter 15 side, or both the dedicated adapter 15 side and the real panel 11 side, can as well be structured for floating.

Figure 3:
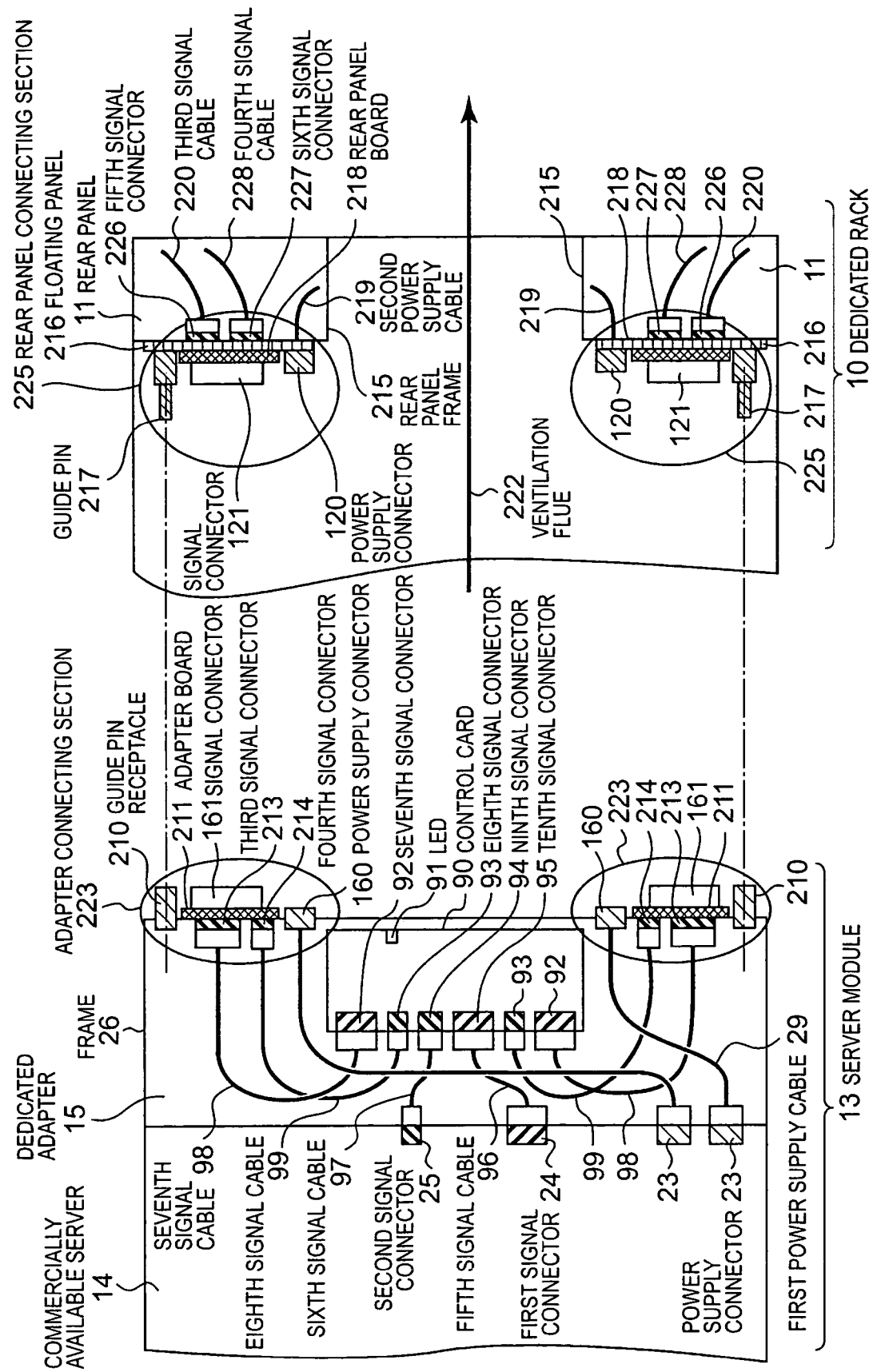
FIG. 3 shows a sectional view of another example of connecting section between the server module 13 and the rear panels 11 in FIG. 1.

FIG. 3 shows a sectional view of a second example of connecting section between the server module 13 and the rear panels 11 in FIG. 1.

The dedicated adapter 15 is fitted to the rear face of the commercially available server 14. The thickness of the dedicated adapter 15 is either equal to or less than that of the commercially available server 14. The commercially available server 14 and the dedicated adapter 15 constitute the server module 13.

The dedicated adapter 15 comprises the frame 26, the adapter connecting sections 223, a control card 90 and various cables. Each of the adapter connecting sections 223 to be connected to the rear panel 11 side comprises the guide pin receptacle 210, the signal connector 161 which is a plug-in connector on each of the front and rear sides, the adapter board 211 mounted with the third signal connector 213 and the fourth signal connector 214, and the power supply connector 160 which is the cable connector connecting section of the first power supply cable 29.

The guide pin receptacle 210, the adapter board 211, and the power supply connector 160 which is the cable connector connecting section of the first power supply cable 29 are fitted to the frame 26.

Two adapter connecting sections 223 are disposed symmetrically on the two sides of the rear face of the server module 13. This double structure is intended to keep the system immune from any trouble arising in either one of the adapter connecting sections 223.

The control card 90 is a relay card for making possible interfacing of the commercially available server 14 and the transfer and coordination of the connecting specification of the adapter connecting sections 223. The control card 90 is fixed to the frame 26 of the dedicated adapter 15. The first signal connector 24 and the second signal connector 25 for interfacing use disposed on the rear face of the commercially available server 14 are connected to a 10th signal connector 95 and a ninth signal connector 94 mounted on the control card 90 respectively via a fifth signal cable 95 and a sixth signal cable 97. A seventh signal connector 92 and an eighth signal connector 93 mounted on the control card 90 are connected to the third signal connector 213 and the fourth signal connector 214 mounted on the adapter board 211 respectively via a seventh signal cable 98 and an eighth signal cable 99. These connections apply to the adapter boards 211 on both sides. Doubling of signals is made possible within the control card 90 even if the commercially available server 14 has only a few interfaces. Also, the mounting of an LED 91 displaying the signal status on the control card 90 enables the operating state of the server module 13 to be recognized from behind the dedicated rack 10.

In the embodiment described above, by configuring the dedicated adapter and the rear panel connecting sections in a prescribed way, it is also possible to enable a commercially available switch, a chassis for commercially available blade servers, a commercially available power supply unit or the like, instead of the commercially available server, to permit plugging in. FIG. 4 through FIG. 9 show cases in which, in addition to the commercially available server, a commercially available switch, a chassis for commercially available blade servers, a commercially available power supply unit or a commercially available disk unit, respectively, is enabled to be plugged in.

Figure 4:
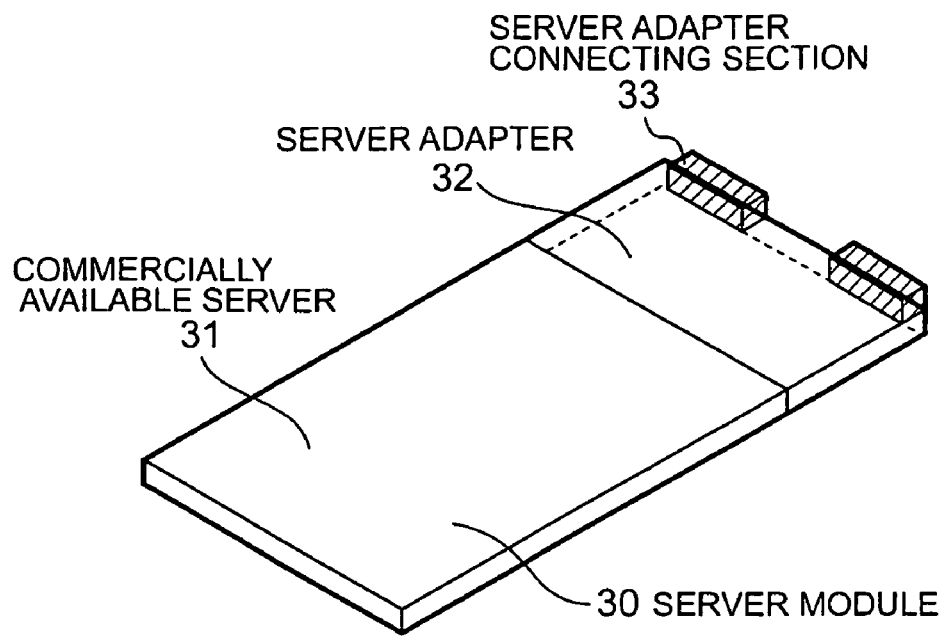
FIG. 4 shows a perspective view of the configuration of a server module in a computer system, which is a second exemplary embodiment of the invention.

As shown in FIG. 4, a server module 30 of the second exemplary embodiment comprises a commercially available server 31 and a server adapter 32. The server adapter 32 has server adapter connecting sections 33 for connection to the rear panel 35 of a dedicated rack 34 on the two sides of the rear face.

Figure 5:
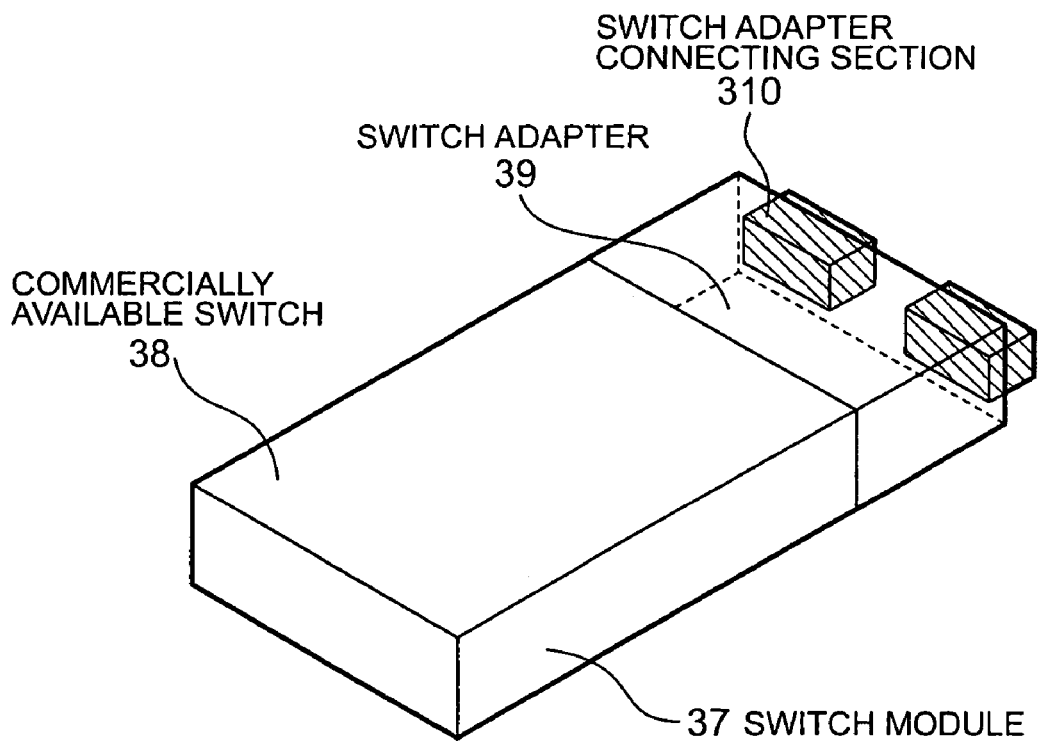
FIG. 5 shows a perspective view of the configuration of a switch module in the computer system, which is the second embodiment of the invention.

As shown in FIG. 5, a switch module 37 of the second embodiment comprises a commercially available switch 38 and a switch adapter 39. The switch adapter 39 has switch adapter connecting sections 310 for connection to the rear panel 35 of the dedicated rack 34 on the two sides of the rear face.

Figure 6:
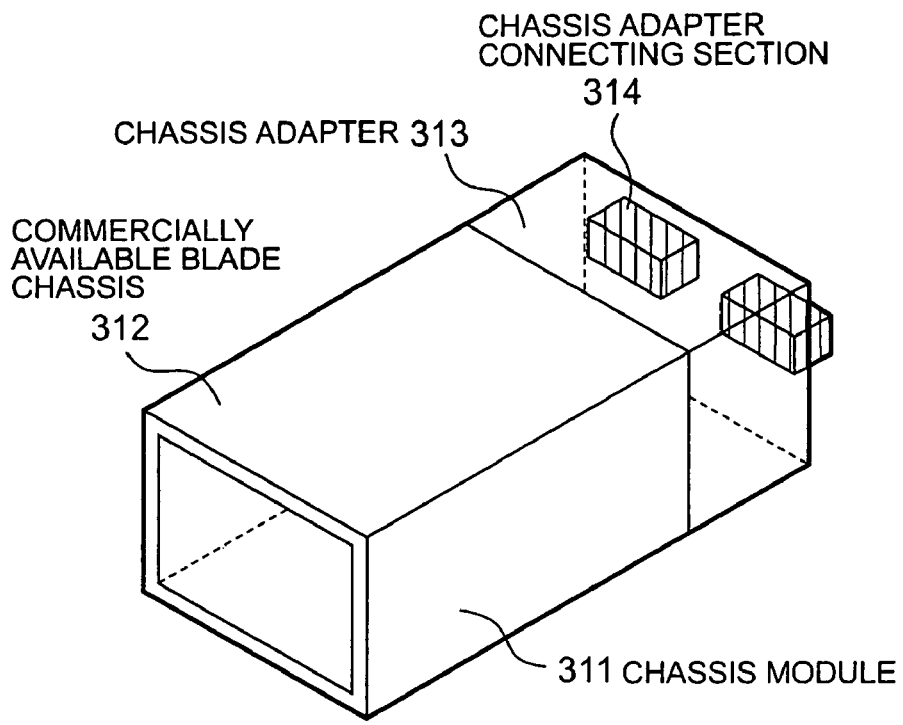
FIG. 6 shows a perspective view of the configuration of a chassis module in the computer system, which is the second embodiment of the invention.

As shown in FIG. 6, a chassis module 311 of the second embodiment comprises a commercially available blade chassis 312 and a chassis adapter 313. The chassis adapter 313 has chassis adapter connecting sections 314 for connection to the rear panel 35 of the dedicated rack 34 on the two sides of the rear face.

Figure 7:
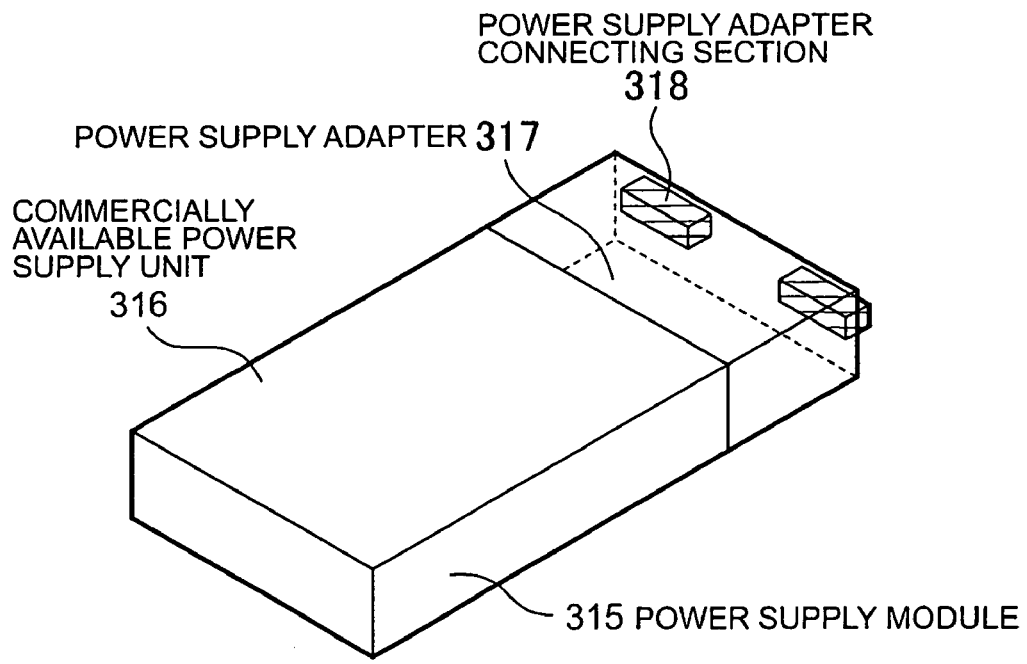
FIG. 7 shows a perspective view of the configuration of a power supply module in the computer system, which is the second embodiment of the invention.

As shown in FIG. 7, a power supply module 315 of the second embodiment comprises a commercially available power supply unit 316 and a power supply adapter 317. The power supply adapter 317 has power supply adapter connecting sections 318 for connection to the rear panel 35 of the dedicated rack 34 on the two sides of the rear face.

Figure 8:
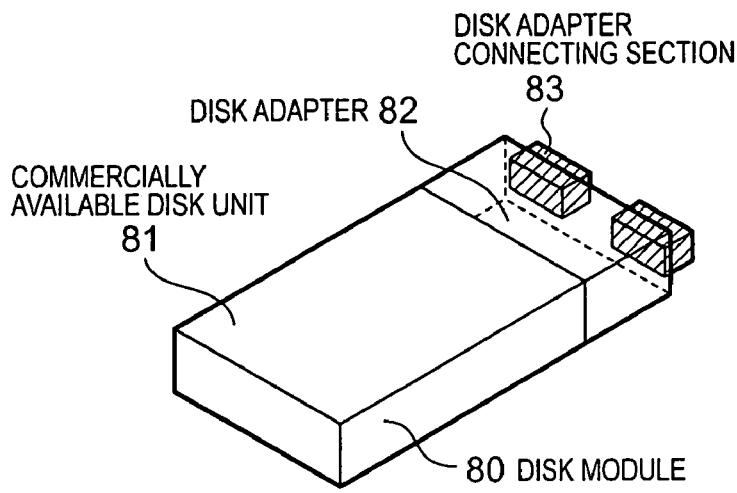
FIG. 8 shows a perspective view of the configuration of a disk module in the computer system, which is the second embodiment of the invention.

As shown in FIG. 8, a disk module 80 of the second embodiment comprises a commercially available disk unit 81 and a disk adapter 82. The disk adapter 82 has disk adapter connecting sections 83 for connection to the rear panel 35 of the dedicated rack 34 on the two sides of the rear face.

Figure 9:
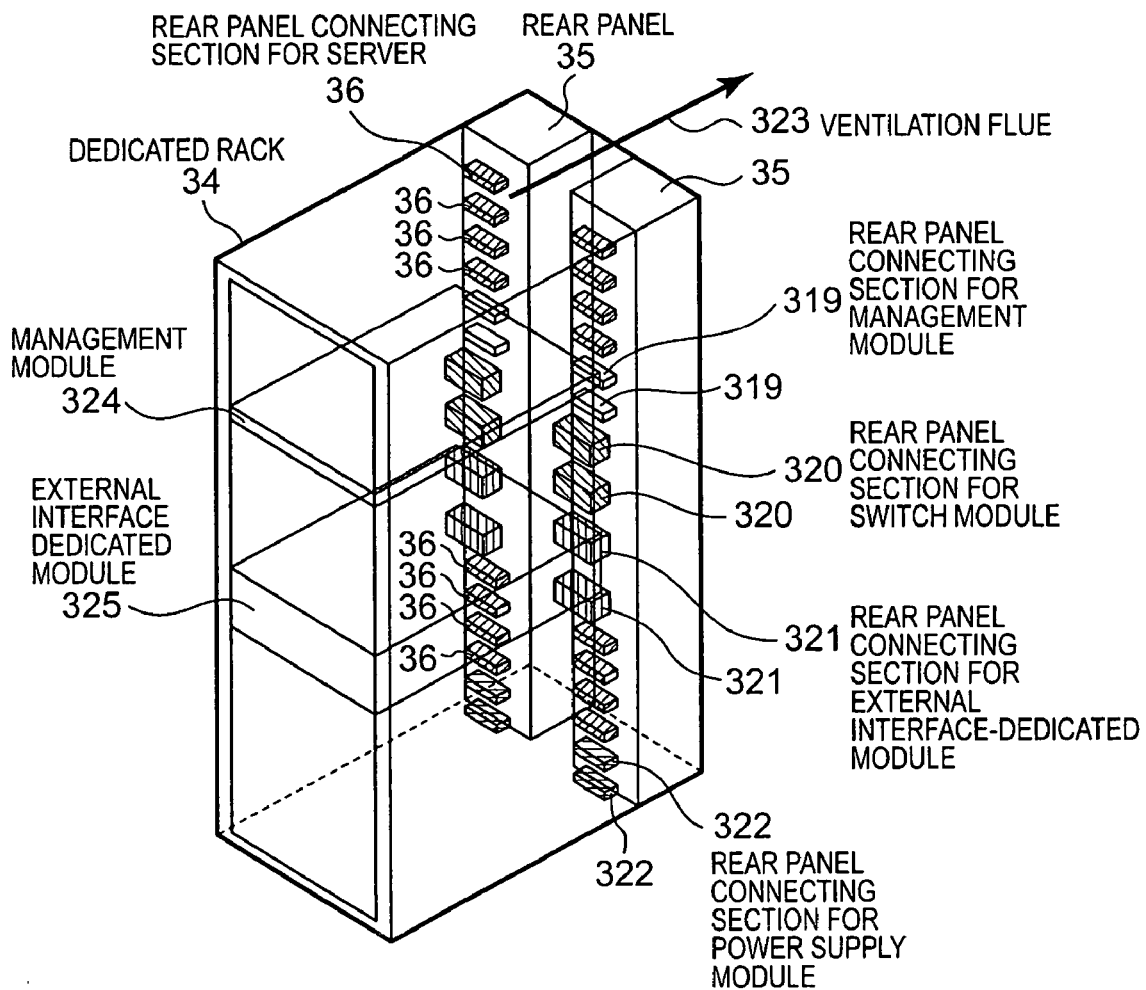
FIG. 9 shows a perspective view of the configuration of a dedicated rack in the computer system, which is the second embodiment of the invention.

As shown in FIG. 9, the dedicated rack 34 of the second embodiment has the rear panels 35 for mounting the modules on two sides. The double structure is intended to keep the system immune from any trouble arising in either one of the rear panels 35. Each of the rear panels 35 has a plurality of rear panel connecting sections for connection to the modules.

Each of the rear panels 35 in this embodiment has a total of 16 slots comprising a subtotal of eight slots made up of four each in the upper and lower parts of a server-rear panel connecting section 36, two in a management module-rear panel connecting section 319, two in a switch module-rear panel connecting section 320, two in an external interface-rear panel connecting section 321 and two in a power supply module-rear panel connecting section 322. The division of the server-rear panel connecting section 36 into the upper and lower parts reflects consideration for balanced cable distribution in the rear panel. The management module, the switch module and the external interface-dedicated module are connected to all the server modules mounted on the dedicated rack. If server modules were clustered in one position, the flow of cables would become unidirectional, resulting in a localized higher density of cables. The divided arrangement of the server modules results in a good balance between upward and downward cables. A suitable slot configuration on the rear panels can be selected as desired for the intended system.

The space between the rear panels 35 on the two sides constitute a ventilation flue 323 for air cooling. Since all the cables connecting the modules are positioned within the rear panels 35, they do not obstruct the ventilation flue 323 and a smooth air flow is thereby ensured.

Modularizing the commercially available switch, the chassis for commercially available blade servers and the commercially available power supply unit in addition to the commercially available server in this way by fitting a dedicated adapter to each, realizes a structure to allow plugging of the commercially available switch, the chassis for commercially available blade servers and the commercially available power supply unit into the rack, resulting in facilitation of system architecture.

What is claimed is:

1. A computer system, comprising:
a plurality of modules for configuring said computer system; and
a rack having two rear panels symmetrically positioned on either side of the rear face of the rack with space for a ventilation flue between the two rear panels, each panel providing a respective power supply of two power supplies or a respective signal connection of two signal connections to each of said modules mounted inside,
wherein each of said modules comprises:

a device having a pair of power supply connectors or signal connectors (pair-on-device), each connector of the pair-on-device not symmetrically positioned on either side of the device, and a dedicated adapter having:

two adapter connecting sections each connected to a different one of said two rear panels, the two adapter connecting sections enabling plug-in mounting on said rack and coordinating double structuring of power supply or signal connection between said device and said rear panels, a pair of power supply connectors or signal connectors (pair-on-adapter), each connector of the pair-on-adapter connected to a different connector of the pair-on-device, and a line pair, each line of the line pair connecting a different connector of the pair-on-adapter and a different one of the two adapter connecting sections;

the device being removably coupled to the dedicated adapter, and the rear panels being removably coupled to the dedicated adapter.

2. The computer system according to claim 1, further comprising an aligning mechanism which, when said modules are to be inserted into said rack, aligns said modules and said rear panels before said module and said rear panels undergo signal connection.

3. The computer system according to claim 2, wherein each of said rear panels has said aligning mechanism.

4. The computer system according to claim 2, wherein the aligning mechanism has guide pins fitted to said rear panels and guide pins receptacle fitted to said modules.

5. The computer system according to claim 1, wherein said modules and said rear panels are connected by power supply connectors for power supply use and signal connectors used in signal connection.

6. The computer system according to claim 5, wherein said power supply connectors and said signal connectors of said rear panels are fitted to said rear panels in floating structures.

7. The computer system according to claim 1, further comprising an intra-rack management module for unified management of the modules mounted within the rack.

8. The computer system according to claim 1, further comprising an interface-dedicated module mounted within the rack to take charge of interfacing of the rack with outside.

9. The computer system according to claim 1, wherein said device is a computer, a switch, a chassis for blade servers, a power supply unit or a disk unit, and said dedicated adapter respectively enables the computer, the switch, the chassis, the power supply unit or the disk unit, to be plugged into the rack, and performs signal coordination between the rear panels and the switch, the chassis for blade servers, the power supply unit or the disk unit.

10. The computer system of claim 1, wherein the device and the rear panels have different interfaces and the device cannot be directly plugged into the rear panels and wherein the dedicated adapter provides that the device communicates with the rear panels through the dedicated adapter.

11. A computer system, comprising:

a plurality of modules for configuring said computer system, each of said modules comprises a device and a dedicated adapter, the dedicated adapter having two adapter connecting units; and a rack having two rear panels symmetrically positioned on either side of the rear face of the rack with space for a ventilation flue between the two rear panels, each panel having a rear panel connecting unit providing a respective power supply of two power supplies or a respective signal connection of two signal connections to each of said modules mounted inside;

wherein each adapter connecting unit removably connecting to said respective rear panel connecting unit of said respective two rear panels, and each of the dedicated adapters enabling plug-in mounting on said rack and coordinating double structuring of power supply or signal connection between said device and said rear panels, each adapter connecting unit adapts a plurality of connectors of said device to one of said rear panel connecting units of the rack with each of the plurality of connectors of the device being not adaptable to both of said rear panel connecting units of the rack.

12. The computer system according to claim 11, further comprising an aligning mechanism which, when said modules are to be inserted into said rack, aligns said modules and said rear panels before said module and said rear panels undergo signal connection.

13. The computer system according to claim 12, wherein each of said rear panels has said aligning mechanism.

14. The computer system according to claim 12, wherein the aligning mechanism has guide pins fitted to said rear panels and guide pins receptacle fitted to said modules.

15. The computer system according to claim 11, wherein said modules and said rear panels are connected by power supply connectors for power supply use and signal connectors used in signal connection.

16. The computer system according to claim 15, wherein said power supply connectors and said signal connectors of said rear panels are fitted to said rear panels in floating structures.

17. The computer system according to claim 11, further comprising an intra-rack management module for unified management of the modules mounted within the rack.

18. The computer system according to claim 11, further comprising an interface-dedicated module mounted within the rack to take charge of interfacing of the rack with outside.

* * * * *